United States Patent
Lu et al.

(10) Patent No.: US 12,035,027 B2
(45) Date of Patent: Jul. 9, 2024

(54) VEHICULAR CAMERA AND LENS ASSEMBLY

(71) Applicant: MAGNA ELECTRONICS INC., Auburn Hills, MI (US)

(72) Inventors: Yuesheng Lu, Farmington Hills, MI (US); Steven V. Byrne, Goodrich, MI (US); Matthew C. Sesti, Williamston, MI (US); Joel S. Gibson, Linden, MI (US); Robert A. Devota, Durand, MI (US)

(73) Assignee: MAGNA ELECTRONICS INC., Auburn Hills, MI (US)

( * ) Notice: Subject to any disclaimer, the term of this patent is extended or adjusted under 35 U.S.C. 154(b) by 495 days.

(21) Appl. No.: 17/450,503

(22) Filed: Oct. 11, 2021

(65) Prior Publication Data
US 2022/0030145 A1    Jan. 27, 2022

Related U.S. Application Data

(63) Continuation of application No. 16/390,081, filed on Apr. 22, 2019, now Pat. No. 11,146,713, which is a
(Continued)

(51) Int. Cl.
*G02B 7/00* (2021.01)
*B60R 11/04* (2006.01)
(Continued)

(52) U.S. Cl.
CPC ............ *H04N 23/55* (2023.01); *B60R 11/04* (2013.01); *G02B 7/003* (2013.01); *G02B 7/02* (2013.01);
(Continued)

(58) Field of Classification Search
CPC ........ G02B 7/025; G02B 7/04; G02B 13/001; G02B 27/0025; G02B 7/02;
(Continued)

(56) References Cited

U.S. PATENT DOCUMENTS 4,712,879 A    12/1987 Lynam et al.
4,786,966 A    11/1988 Hanson et al.
(Continued)

FOREIGN PATENT DOCUMENTS

CN    01059596 A    3/1992
CN    1743887 A    3/2006
(Continued)

OTHER PUBLICATIONS

International Search Report and Written Opinion for corresponding PCT Application No. PCT/US2010/028621.
(Continued)

*Primary Examiner* — Mustak Choudhury
(74) *Attorney, Agent, or Firm* — HONIGMAN LLP

(57) ABSTRACT

A vehicular camera includes a camera housing having a rear camera housing and a front camera housing. The front camera housing includes a lens, an imager and an imager printed circuit board. The lens is held in position relative to the imager by a UV-curable adhesive. With the lens held in position relative to the imager by the adhesive, the outer surface of the imager is devoid of the adhesive and an air gap exists between the lens and the outer surface of the imager. With the adhesive disposed in an uncured state on the imager printed circuit board and laterally outboard of the imager, and with the lens positioned relative to the imager, the adhesive is cured from its uncured state to an at least partially-cured state by exposure to UV light. The rear housing portion is joined at the front housing portion.

22 Claims, 8 Drawing Sheets

Related U.S. Application Data continuation of application No. 15/149,337, filed on May 9, 2016, now Pat. No. 10,270,949, which is a continuation of application No. 14/033,964, filed on Sep. 23, 2013, now Pat. No. 9,338,334, which is a continuation of application No. 13/260,400, filed as application No. PCT/US2010/028621 on Mar. 25, 2010, now Pat. No. 8,542,451.

(60) Provisional application No. 61/232,544, filed on Aug. 10, 2009, provisional application No. 61/163,240, filed on Mar. 25, 2009.

(51) Int. Cl.
| | | |
|---|---|---|
| *G02B 7/02* | (2021.01) | |
| *G02B 7/04* | (2021.01) | |
| *G02B 13/00* | (2006.01) | |
| *G02B 27/00* | (2006.01) | |
| *G02B 27/62* | (2006.01) | |
| *H01L 27/146* | (2006.01) | |
| *H04N 23/51* | (2023.01) | |
| *H04N 23/54* | (2023.01) | |
| *H04N 23/55* | (2023.01) | |
| *H04N 23/57* | (2023.01) | |
| *H04N 23/63* | (2023.01) | |

(52) U.S. Cl.
CPC ............ *G02B 7/025* (2013.01); *G02B 7/04* (2013.01); *G02B 13/001* (2013.01); *G02B 27/0025* (2013.01); *G02B 27/62* (2013.01); *H01L 27/14618* (2013.01); *H01L 27/14625* (2013.01); *H04N 23/51* (2023.01); *H04N 23/54* (2023.01); *H04N 23/57* (2023.01); *H04N 23/63* (2023.01); *H01L 2924/0002* (2013.01); *Y10T 29/49002* (2015.01)

(58) Field of Classification Search
CPC ........ H01L 27/14618; H01L 27/14625; H04N 5/2257; H04N 5/2253
See application file for complete search history.

(56) References Cited

U.S. PATENT DOCUMENTS

| | | |
|---|---|---|
| 5,073,012 A | 12/1991 | Lynam |
| 5,076,673 A | 12/1991 | Lynam et al. |
| 5,115,346 A | 5/1992 | Lynam |
| 5,140,455 A | 8/1992 | Varaprasad et al. |
| 5,142,407 A | 8/1992 | Varaprasad et al. |
| 5,151,816 A | 9/1992 | Varaprasad et al. |
| 5,253,109 A | 10/1993 | O'Farrell et al. |
| 5,371,659 A | 12/1994 | Pastrick et al. |
| 5,406,414 A | 4/1995 | O'Farrell et al. |
| 5,423,147 A * | 6/1995 | Dupuy .................. E06B 7/2303 49/490.1 |
| 5,497,306 A | 3/1996 | Pastrick |
| 5,525,264 A | 6/1996 | Cronin et al. |
| 5,550,677 A | 8/1996 | Schofield et al. |
| 5,559,556 A | 9/1996 | Kagebeck |
| 5,567,360 A | 10/1996 | Varaprasad et al. |
| 5,610,756 A | 3/1997 | Lynam et al. |
| 5,657,539 A | 8/1997 | Orikasa et al. |
| 5,668,663 A | 9/1997 | Varaprasad et al. |
| 5,669,699 A | 9/1997 | Pastrick et al. |
| 5,670,935 A | 9/1997 | Schofield et al. |
| 5,724,187 A | 3/1998 | Varaprasad et al. |
| 5,760,962 A | 6/1998 | Schofield et al. |
| 5,796,094 A | 8/1998 | Schofield et al. |
| 5,821,532 A | 10/1998 | Beaman et al. |
| 5,823,654 A | 10/1998 | Pastrick et al. |
| 5,854,708 A | 12/1998 | Komatsu et al. |
| 5,872,332 A | 2/1999 | Verma |
| 5,877,897 A | 3/1999 | Schofield et al. |
| 5,910,854 A | 6/1999 | Varaprasad et al. |
| 5,949,331 A | 9/1999 | Schofield et al. |
| 5,978,017 A | 11/1999 | Tino |
| 6,002,511 A | 12/1999 | Varaprasad et al. |
| 6,013,372 A | 1/2000 | Hayakawa et al. |
| 6,071,606 A | 6/2000 | Yamazaki et al. |
| 6,072,814 A | 6/2000 | Ryan et al. |
| 6,097,023 A | 8/2000 | Schofield et al. |
| 6,117,193 A | 9/2000 | Glenn |
| 6,151,065 A | 11/2000 | Steed et al. |
| 6,154,306 A | 11/2000 | Varaprasad et al. |
| 6,176,602 B1 | 1/2001 | Pastrick et al. |
| 6,178,034 B1 | 1/2001 | Allemand et al. |
| 6,193,378 B1 | 2/2001 | Tonar et al. |
| 6,201,642 B1 | 3/2001 | Bos |
| 6,222,447 B1 | 4/2001 | Schofield et al. |
| 6,259,475 B1 | 7/2001 | Ramachandran et al. |
| 6,276,821 B1 | 8/2001 | Pastrick et al. |
| 6,292,311 B1 | 9/2001 | Bohn et al. |
| 6,302,545 B1 | 10/2001 | Schofield et al. |
| 6,320,176 B1 | 11/2001 | Schofield et al. |
| 6,353,392 B1 | 3/2002 | Schofield et al. |
| 6,396,397 B1 | 5/2002 | Bos et al. |
| 6,454,449 B2 | 9/2002 | Nestell et al. |
| 6,481,003 B1 | 11/2002 | Maeda |
| 6,483,101 B1 | 11/2002 | Webster |
| 6,498,620 B2 | 12/2002 | Schofield et al. |
| 6,523,964 B2 | 2/2003 | Schofield et al. |
| 6,535,242 B1 | 3/2003 | Strumolo et al. |
| 6,559,435 B2 | 5/2003 | Schofield et al. |
| 6,559,439 B1 | 5/2003 | Tsuchida et al. |
| 6,590,658 B2 | 7/2003 | Case et al. |
| 6,603,612 B2 | 8/2003 | Nakano |
| 6,611,202 B2 | 8/2003 | Schofield et al. |
| 6,651,187 B2 | 11/2003 | Lacey, III |
| 6,654,187 B2 | 11/2003 | Ning |
| 6,690,268 B2 | 2/2004 | Schofield et al. |
| 6,717,610 B1 | 4/2004 | Bos et al. |
| 6,757,109 B2 | 6/2004 | Bos |
| 6,805,767 B2 | 10/2004 | Shinomiya |
| 6,806,452 B2 | 10/2004 | Bos et al. |
| 6,822,563 B2 | 11/2004 | Bos et al. |
| 6,831,261 B2 | 12/2004 | Schofield et al. |
| 6,891,563 B2 | 5/2005 | Schofield et al. |
| 6,897,432 B2 | 5/2005 | Schmidtke et al. |
| 6,946,978 B2 | 9/2005 | Schofield |
| 6,977,619 B2 | 12/2005 | March et al. |
| 7,004,606 B2 | 2/2006 | Schofield |
| 7,005,974 B2 | 2/2006 | McMahon et al. |
| 7,015,944 B2 | 3/2006 | Holz et al. |
| 7,031,075 B2 | 4/2006 | Tsuji |
| 7,038,577 B2 | 5/2006 | Pawlicki et al. |
| 7,095,123 B2 | 8/2006 | Prior |
| 7,095,572 B2 | 8/2006 | Lee et al. |
| 7,123,168 B2 | 10/2006 | Schofield |
| 7,215,479 B1 | 5/2007 | Bakin |
| 7,255,451 B2 | 8/2007 | McCabe et al. |
| 7,268,957 B2 | 9/2007 | Frenzel et al. |
| 7,339,149 B1 | 3/2008 | Schofield et al. |
| 7,370,983 B2 | 5/2008 | DeWind et al. |
| 7,391,458 B2 | 6/2008 | Sakamoto |
| 7,419,315 B2 | 9/2008 | Hirata et al. |
| 7,423,665 B2 | 9/2008 | Ray et al. |
| 7,453,509 B2 | 11/2008 | Losehand et al. |
| 7,599,134 B2 | 10/2009 | Bechtel et al. |
| 7,768,574 B2 | 8/2010 | Humpston |
| 7,965,336 B2 | 6/2011 | Bingle et al. |
| 8,064,146 B2 | 11/2011 | Iwasaki |
| 8,120,652 B2 | 2/2012 | Bechtel et al. |
| 8,318,512 B2 | 11/2012 | Shah et al. |
| 8,542,451 B2 | 9/2013 | Lu et al. |
| 9,277,104 B2 | 3/2016 | Sesti et al. |
| 9,338,334 B2 | 5/2016 | Lu et al. |
| 10,270,949 B2 | 4/2019 | Lu et al. |
| 11,146,713 B2 | 10/2021 | Lu et al. |
| 2002/0159270 A1 | 10/2002 | Lynam et al. |
| 2003/0090569 A1 | 5/2003 | Poechmueller |
| 2003/0137595 A1 | 7/2003 | Takachi |

(56) References Cited

U.S. PATENT DOCUMENTS

| | | |
|---|---|---|
| 2004/0016870 A1 | 1/2004 | Pawlicki et al. |
| 2004/0032321 A1 | 2/2004 | McMahon et al. |
| 2004/0051634 A1 | 3/2004 | Schofield et al. |
| 2005/0018103 A1* | 1/2005 | Lubart ............... G02F 1/133615 349/61 |
| 2005/0104995 A1 | 5/2005 | Spryshak et al. |
| 2005/0190283 A1 | 9/2005 | Ish-Shalom et al. |
| 2005/0232469 A1 | 10/2005 | Schofield et al. |
| 2005/0274883 A1 | 12/2005 | Nagano |
| 2006/0038668 A1 | 2/2006 | DeWard et al. |
| 2006/0049533 A1 | 3/2006 | Kamoshita |
| 2006/0050018 A1 | 3/2006 | Hutzel et al. |
| 2006/0054802 A1 | 3/2006 | Johnston |
| 2006/0056077 A1 | 3/2006 | Johnston |
| 2006/0061008 A1 | 3/2006 | Karner et al. |
| 2006/0065436 A1 | 3/2006 | Gally et al. |
| 2006/0077575 A1 | 4/2006 | Nakai et al. |
| 2006/0125919 A1 | 6/2006 | Camilleri et al. |
| 2006/0171704 A1 | 8/2006 | Bingle et al. |
| 2006/0184297 A1 | 8/2006 | Higgins-Luthman |
| 2007/0096020 A1 | 5/2007 | Mitsugi et al. |
| 2007/0279518 A1 | 12/2007 | Apel et al. |
| 2008/0024883 A1* | 1/2008 | Iwasaki ............... H04N 23/55 348/E5.026 |
| 2008/0043105 A1 | 2/2008 | Kallhammer et al. |
| 2009/0010494 A1* | 1/2009 | Bechtel ............... G01S 11/12 382/104 |
| 2009/0012203 A1 | 1/2009 | Nakanishi et al. |
| 2009/0244361 A1 | 10/2009 | Gebauer et al. |
| 2010/0103308 A1* | 4/2010 | Butterfield ........ H01L 27/14685 348/340 |
| 2010/0279439 A1 | 11/2010 | Shah et al. |
| 2011/0211246 A1* | 9/2011 | Agrawal ............... G02F 1/161 977/932 |
| 2011/0298968 A1 | 12/2011 | Tseng et al. |
| 2014/0000804 A1 | 1/2014 | Looi et al. |
| 2014/0022657 A1 | 1/2014 | Lu et al. |

FOREIGN PATENT DOCUMENTS

| | | |
|---|---|---|
| EP | 1271214 A1 | 1/2003 |
| EP | 1351316 A2 | 10/2003 |
| EP | 1605520 A1 | 12/2005 |
| JP | 08084277 | 3/1996 |
| JP | 2006-293100 A | 10/2006 |
| JP | 2006-350372 A | 12/2006 |
| WO | 2001044850 A2 | 6/2001 |
| WO | 2004010679 A2 | 1/2004 |
| WO | 2006029995 A1 | 3/2006 |
| WO | 2006029996 A1 | 3/2006 |
| WO | 2007053404 A2 | 5/2007 |
| WO | 2011111465 A1 | 9/2011 |

OTHER PUBLICATIONS

European Search Report dated Oct. 11, 2012 for corresponding European patent application No. 10756831.3.

* cited by examiner

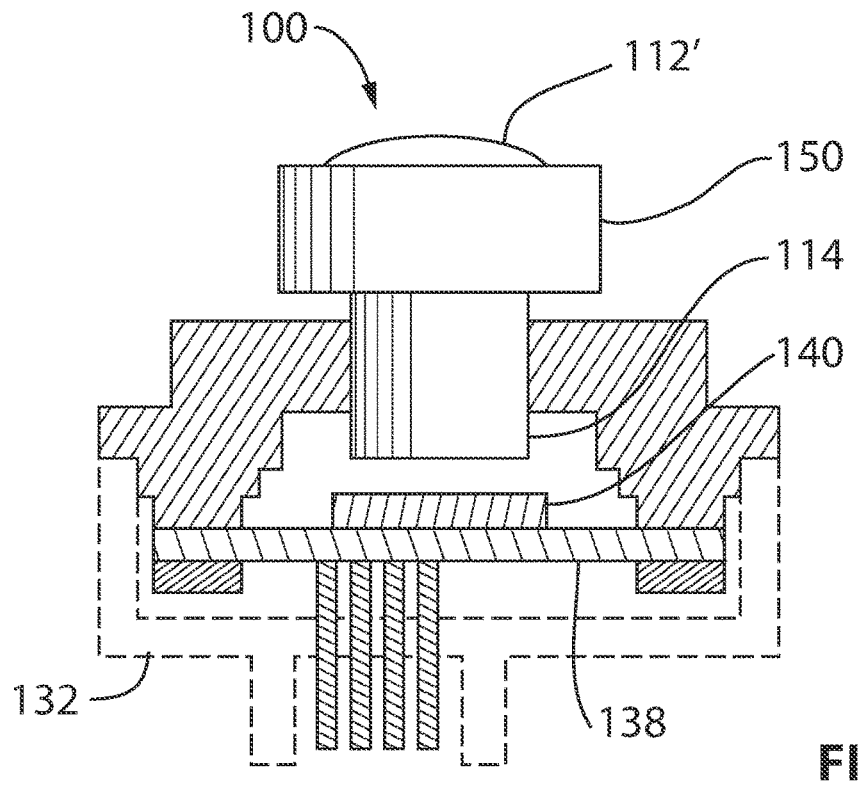
FIG. 5
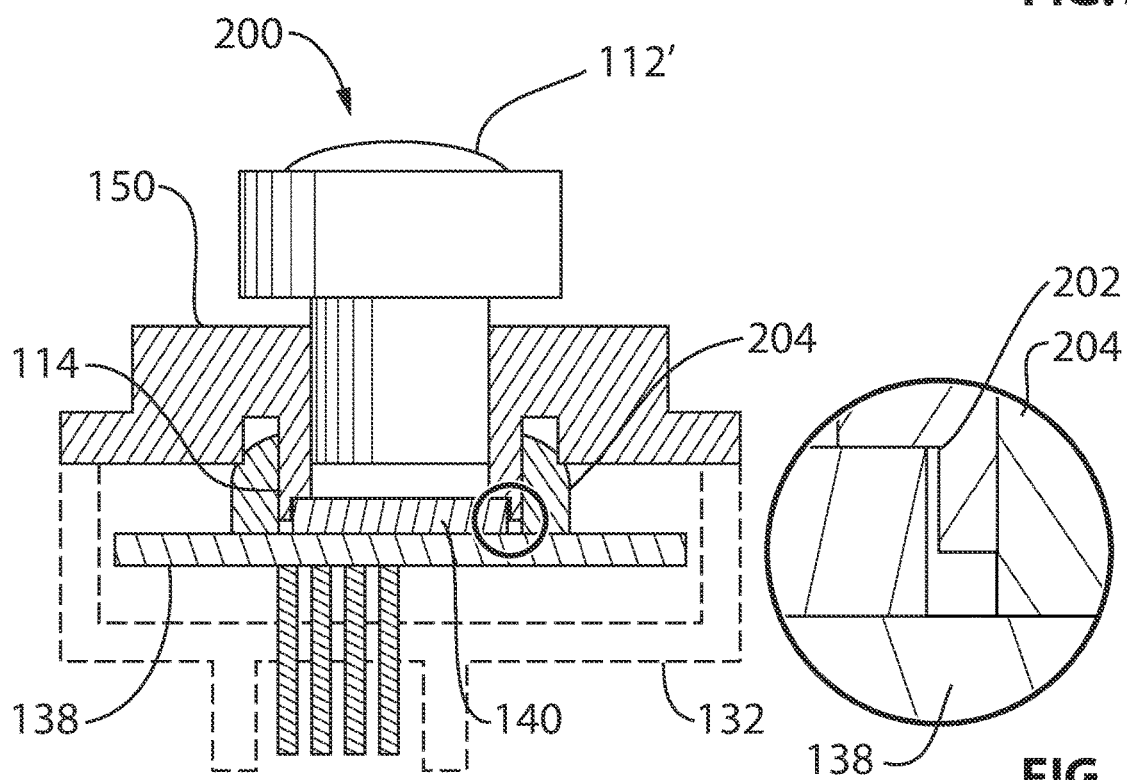
FIG. 6
FIG. 6A

- Contrast sensitivity functions of seven age groups -
(after Schieber, 1992)

VEHICULAR CAMERA AND LENS ASSEMBLY

CROSS-REFERENCE TO RELATED APPLICATIONS

This application is a continuation of U.S. patent application Ser. No. 16/390,081, filed Apr. 22, 2019, now U.S. Pat. No. 11,146,713, which is a continuation of U.S. patent application Ser. No. 15/149,337, filed May 9, 2016, now U.S. Pat. No. 10,270,949, which is a continuation of U.S. patent application Ser. No. 14/033,964, filed Sep. 23, 2013, now U.S. Pat. No. 9,338,334, which is a continuation of U.S. patent application Ser. No. 13/260,400, filed Sep. 26, 2011, now U.S. Pat. No. 8,542,451, which is a 371 national phase filing of PCT Application No. PCT/US10/28621, filed Mar. 25, 2010, which claims the benefit of U.S. provisional application Ser. No. 61/232,544, filed Aug. 10, 2009, and U.S. provisional application Ser. No. 61/163,240, filed Mar. 25, 2009, the contents of both of which are incorporated herein.

FIELD OF THE INVENTION

The invention relates to vehicular cameras, and more particularly, to low cost construction and assembly of such cameras.

BACKGROUND OF THE INVENTION

Vehicular cameras are used for a variety of purposes, such as to assist a driver in avoiding obstacles behind a vehicle when backing up, and to detect imminent collisions ahead of the vehicle when driving forward. A vehicular camera includes a lens that focuses video input on an image sensor provided on an imager. In general, the position of the lens relative to the image sensor can impact the quality of the video input received by the image sensor. For example, if the lens is positioned such that the video input is not in focus, then the video information passed to the driver may be blurry, and other vehicular systems, such as a collision detection system for example, may not function as well as they otherwise could. As the size of the camera is reduced, the positioning of the lens relative to the image sensor may be relatively more critical, at least because small variations in position can result in relatively large changes in angular offset. Therefore, the positioning of the lens relative to the image sensor may be particularly critical for vehicular rearview cameras. Furthermore, it is important that the camera be capable of holding the lens in position over a selected period of time under certain operating conditions, so that the performance of the camera is maintained over a useful operating life.

Several aspects of the camera may contribute to the overall tolerance in the position of the lens relative to the image sensor. For example, for lenses and lens holders that are threaded, the threaded connection therebetween has a tolerance associated with it. The angle of cast of the lens holder has a tolerance associated with it. The position of the imager has a tolerance associated with it.

It is desirable to provide a more integrated, lower cost camera assembly with means for positioning the lens relative to the imager within tolerance.

SUMMARY OF THE INVENTION

In one aspect, the invention is directed to a vehicular camera having a lens that is mounted to a lens holder and is held in position by a selected adhesive. The adhesive is capable of being initially cured relatively quickly by exposure to UV light for supporting the lens relative to the lens holder. The adhesive is further capable of being cured by exposure to a secondary curing condition, such as by exposure to heat, to achieve a fully cured strength, which may take a relatively longer period of time, such as minutes or hours. By providing an adhesive that is initially curable quickly but that reaches a selected fully cured strength and selected performance characteristics, the camera lends itself to having the lens positioned by a robot and then having the adhesive cured quickly to fix the position of the lens so that the camera can be transferred from the robot to a curing fixture for exposure to the secondary curing condition to fully cure the adhesive. Thus, the robot, which may be a relatively expensive component of a system used to manufacture the camera, can be used to adjust the lens of another camera, which may then be transferred to another curing fixture.

In a particular embodiment, the invention is directed to a vehicular camera including a lens, a lens holder, and an imager. The lens is connected to the lens holder by an adhesive. The adhesive is curable by UV light sufficiently to support the lens in the lens holder. The adhesive is further curable to a fully cured strength when exposed to a secondary curing step. The adhesive is configured to provide at least a selected strength of bond between the lens and lens holder when exposed to at least one selected operating condition for a selected period of time. The imager includes an image sensor positioned for receiving video input from the lens. The camera is configured to transmit to at least one other vehicular device signals relating to the video input received by the imager. In a further particular embodiment, the adhesive may be referred to as adhesive AD VE 43812 by Delo Industrial Adhesives of Windach, Germany.

In another aspect, a vehicular camera is provided which includes a first camera housing having an integrated barrel portion for holding optical components; optical components mounted in the barrel portion so as to form a lens; a retainer cap mounted to the barrel portion for containing and vertically positioning the optical components in the barrel portion; imaging circuitry including an image sensor positioned for receiving optical images from the lens; and a second camera housing, connected to the first camera housing so as to encase the imaging circuitry.

In another aspect, a vehicular camera is provided which includes a lens including a lens barrel holding optical components therein; an imager for receiving images from the lens; and a housing encasing the imager and a portion of the lens barrel. The lens barrel includes a feature for guiding and seating a periphery of the lens barrel onto the surface of the imager. Means such as adhesive or solderable retainer pins are provided for securing the lens barrel to the imager. And means are provided for ensuring focus between the lens and imager. The lens barrel may also be integrated with at least a portion of the housing.

In another aspect, a vehicular camera is provided which includes a lens including a lens barrel holding optical components therein; an imager for receiving images from the lens; a printed circuit board (PCB) for mounting the imager; a lens holder for mounting the lens barrel, the lens holder including a feature for guiding the lens barrel transversely relative to the imager; set screws for mounting the PCB to the lens holder; and means such as compressive gaskets, wave washers or lock washer in combination with the set screws to hold the axial position of the PCB and imager relative to the lens.

In another aspect, a vehicular camera is provided which includes a first camera housing having an integrated barrel portion for holding optical components; optical components mounted in the barrel portion so as to form a lens; an imager for receiving images from the lens; a printed circuit board (PCB) for mounting the imager; and a second camera housing to which the PCB is mounted, where the first and second camera housings in combination encasing the imager and PCB. The first and second camera housing are secured via UV-cured adhesive that is cured with UV light only after the position of the second camera housing relative to the first camera housing is set to bring the lens in focus and optically center-aligned with the imager.

In another aspect, a vehicular camera is provided which includes a camera housing having an integrated barrel portion for holding optical components; optical components mounted in the barrel portion so as to form a lens; an imager for receiving images from the lens; a printed circuit board (PCB) for mounting the imager. The PCB is secured to the camera housing by a UV-cured adhesive that is cured only after the position of PCB relative to the housing is set to bring the lens in focus and optically center-aligned with the imager.

In another aspect, a vehicular camera is provided which includes a lens including a lens barrel holding optical components therein; an imager for receiving images from the lens; and a printed circuit board (PCB) for mounting the imager. The lens barrel is directly secured to the imager by a transparent UV-cured adhesive fixing the lens barrel to at least one of the imager and the PCB. The adhesive is cured only after the position of lens barrel relative to the imager is set to bring the lens in focus and optically center-aligned with the imager.

In another aspect, an improved vehicular camera system is provided where the lens resolution is selected to meet but not substantially exceed a resolution determined from the size of a display, a distance between an observer and the display, a selected point on a contrast sensitivity function, and the size of an imager sensing surface.

In another aspect, an improved vehicular camera system is provided where wherein the lens omits achromatic lenses and employs digital chromatic correction based on a predetermined chromatic aberration measurement.

BRIEF DESCRIPTION OF THE DRAWINGS

The invention will now be described by way of example only with reference to the attached drawings in which:

FIG. 5 is a schematic cross-sectional view of a second embodiment of the invention wherein a lens barrel is integrated with a camera lens holder;

FIG. 6 is a schematic cross-sectional view of a third embodiment of the invention wherein a lens barrel is dropped on a surface of an imager;

FIG. 6A is a detail view of a portion of FIG. 6;

DETAILED DESCRIPTION OF THE INVENTION

Embodiment 1—Use of UV-Curable Adhesive to Mount Lens to Holder

Figure 1:
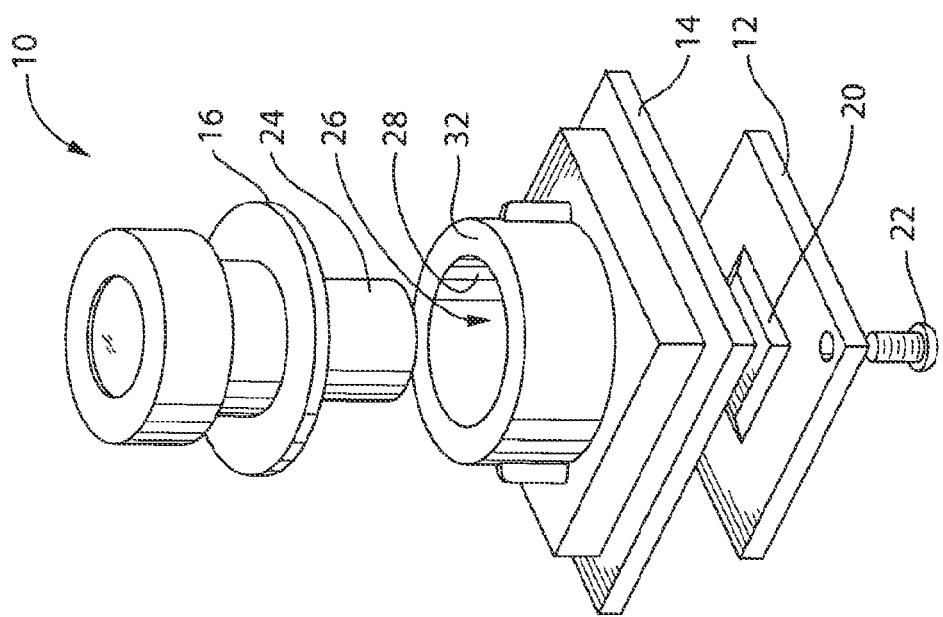
FIG. 1 is an exploded perspective view of a vehicular camera in accordance with an first embodiment of the invention wherein a lens barrel is adhesively secured to a lens holder via a UV-curable adhesive.

FIG. 1 shows an exploded view of a vehicular camera 10 in accordance with a first embodiment of the invention. The vehicular camera 10 includes an imager 20, a lens holder such as a front camera housing 14 and a lens 16. The vehicular camera 10 may include other components such as additional circuitry for processing the video input received by the imager 20, e.g., circuitry for providing graphic overlay to the video input. The vehicular camera 10 may further be configured to transmit the video input to other vehicular devices, such as a display controller (not shown) for a cabin-mounted display (not shown).

Figure 2:
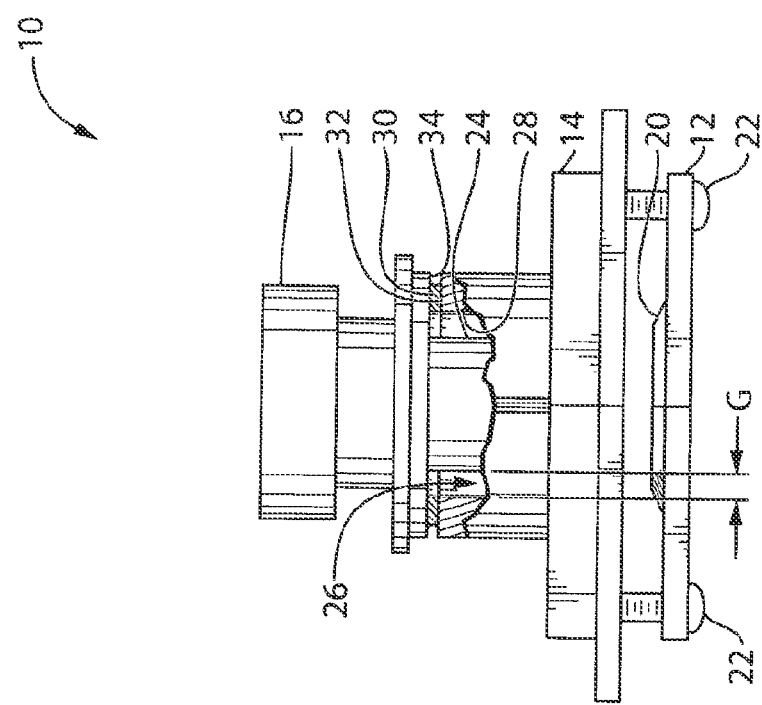
FIG. 2 is a cutaway side view of the vehicular camera shown in FIG. 1, in an assembled state.

The imager 20 may be a charge-coupled device (CCD) or a complimentary metal-oxide semiconductor (CMOS) sensor. Referring additionally to FIG. 2, the imager 20 is mounted to a printed circuit board (PCB) 12. The imager 20 is positioned to receive optical images from the lens 16. In the exemplary embodiment shown in FIG. 1, the imager 20 is connected to the lens holder 14 by a plurality of threaded fasteners 22.

The lens 16 is mounted to the lens holder/front camera housing 14 at a selected position for focusing video input onto the sensing surface of the imager 20. The lens 16 may be any suitable type of lens known in the art. The lens 16 may have an exterior surface 24 that is configured to be received in a cylindrical aperture 26 having an aperture wall 28 on the lens holder/front camera housing 14. The exterior surface 24 and the aperture wall 28 may have a selected amount of clearance therebetween, shown by a gap G. An adhesive 30 is provided for holding the lens 16 in a specific position relative to the lens holder/front camera housing 14. More particularly, the adhesive 30 may be applied between a first axial face 32 on the lens holder/front camera housing 14, and a second axial face 34 on the lens 16.

The position of the lens 16 relative to the imager 20 impacts the degree of focus present in the optical images received by the imager 20 and thus the performance of the camera 10 and the optical alignment of the optical image on the imager.

To control the position of the lens 16, a positioning system (not shown) may be provided that includes a robot (not shown). The robot holds and adjusts the position of the lens 16 relative to the lens holder/front camera housing 14 until a target object appears in suitable focus and at a suitable position on the imager 20, prior to hardening of the adhesive 30. The adjustment of the lens 16 relative to the lens holder/front camera housing 14 is facilitated by providing the selected amount of clearance between the exterior surface 24 of the lens 16 and the aperture wall 28 of the lens holder/front camera housing 14. Additionally, the thickness of the layer of adhesive 30 between the lens 16 and lens holder/front camera housing 14 may be selected to provide a suitable amount of relative angular adjustment between the lens 16 and lens holder 14/front camera housing. The thickness of the layer of adhesive may be approximately 0.75 mm prior to adjustment of the lens 16.

Once the lens 16 has been suitably positioned by the robot, the adhesive 30 is initially cured by exposure to UV light while the robot holds the lens 16 in position. The UV light may be provided from a plurality of UV sources about the periphery of the camera 10. The initial curing of the adhesive 30 may result in the adhesive being strong enough to hold the lens 16 in the lens holder/front camera housing 14 without needing the robot to grip the lens 16, and may take less than 7 seconds. However, the lens 16 may be susceptible to movement if it incurs a relatively small disturbance at this stage. After the initial curing, the camera 10 may be placed by the robot relatively gently on a conveyor (not shown) and moved to a UV curing station (not shown) for a further UV curing period, such as, for example, 25 seconds. Another UV curing station (not shown) may optionally be provided to further cure the adhesive 30 for another period, such as 25 seconds, after the camera 10 leaves the first UV curing station. Subsequent to the UV curing, the camera 10 may be transferred to another curing station where the adhesive 30 can be thermally cured, or may be cured by exposure to some other secondary curing condition, to achieve its fully cured strength so that it can hold the lens 16 in position during use on a vehicle. The step of initially curing the adhesive 30 using UV light may be relatively instantaneous. This step of thermally curing the adhesive may take several minutes or hours. As an additional or alternative curing measure, the adhesive 30 may be moisture cured.

Providing an adhesive 30 that has an initial curability by UV light is advantageous in that the robot is not needed to hold the lens 16 in position over the period of time that it would take for the secondary curing condition to sufficiently harden the adhesive 30 to be self-supporting. Once the camera 10 is transferred from the robot to the curing fixture, the robot can be used for the positioning of another lens 16 in another lens holder 14/front camera housing. Because the task of positioning the lens 16 and initially curing the adhesive 30 using UV light can take less time than fully thermally curing of the adhesive 30, a single robot can feed cameras 10 with initially cured lenses to a plurality of curing fixtures, thereby providing the capability of achieving a relatively high rate of production per robot.

Once fully cured, the adhesive 30 may be capable of holding the lens 16 in position with at least a selected strength of bond between the lens 16 and lens holder/front camera housing 14 under one or more selected operating conditions. For example, the adhesive 30 may be capable of holding the lens 16 in position after a selected time period of 1000 hours of exposure to a selected temperature of 85 degrees Celsius and optionally a humidity of approximately 85%. Any of the aforementioned selected values may be selected to suit the particular environment that the camera 10 is expected to experience during use. The selected time period may, for example, be some other time period, such as approximately 1200 hours. The selected adhesive 30 may be further capable of holding the lens 16 in position after a selected time period exposed to a selected temperature of −40 degrees Celsius. The fully cured adhesive 30 may have other performance characteristics including: maintaining at least 70% of its strength (e.g., tensile strength) during exposure to temperatures ranging from −40 degrees Celsius to 95 degrees Celsius, having a tensile strength of at least 1000 psi, having a Shore D hardness value of at least 50, having a viscosity of between about 30000 and 70000 centipoise, being non-hygroscopic (so that it does not swell significantly when exposed to moisture), having a cure depth of at least 3 mm, having the capability to bond to Polybutylene Terephtalate/Polycarbonate and/or Polyphenylene Sulfide and/or liquid crystal polymer and/or anodized aluminum, having a bond shear strength of at least 1000 psi with less than a 60% reduction in its bond shear strength at 85 degrees Celsius, little or no outgassing, being capable of withstanding exposure to salt fog, being capable of withstanding typical automotive chemicals, such as gasoline and automotive cleaning agents, having a glass transition temperature that is at least 90 degrees Celsius and being 'automotive-grade' (i.e., being generally applicable for use in a vehicle).

The adhesive 30 may be applied by the robot itself prior to adjustment of the lens 16 relative to the lens holder/front camera housing 14. Alternatively, the adhesive 30 may be applied by some other device prior to (or during) possession of the camera 10 by the robot.

Aside from fixing the position of the lens 16 relative to the lens holder/front camera housing 14, the adhesive 30 may also hermetically seal the interior of the camera 10 against the outside environment.

Numerous adhesives were attempted for use as the adhesive 30. For example, it was found that some adhesives, such as some UV-cure free radical acrylates that have the capability of being initially cured using UV light, have a reduced strength (e.g., tensile strength) under exposure to elevated operating temperatures such as 85 degrees Celsius over a selected period of time. It was further found that adhesives, such as some UV-curable free radical epoxy hybrids also have a reduced strength (e.g., tensile strength) under exposure to elevated operating temperatures such as 85 degrees Celsius over a selected period of time. Some cationic epoxies that were tried also lost their strength when exposed to a temperature of 85 degrees Celsius and a humidity of 85% over a selected period of time. Some anionic cyanoacrylates that were tried were unsuitable as they produced too much outgas for optical use. Other adhesives, such as some UV-cure free radical silicones have a relatively low dimensional stability and are thus not suitable.

Surprisingly, it was found that a suitable adhesive that can be used for the adhesive is adhesive AD VE 43812 manufactured by Delo Industrial Adhesives of Windach, Germany. This adhesive is a low-temperature cure, epoxy-amine adhesive that can be cured initially relatively quickly by exposure UV light.

Figure 3:
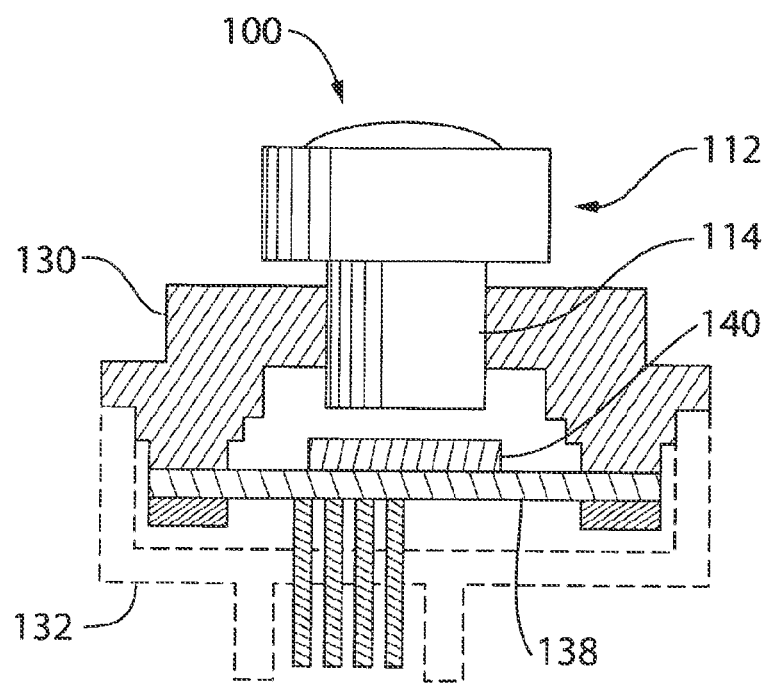
FIG. 3 is a schematic cross-sectional view of a variant of the first embodiment.
Figure 4:
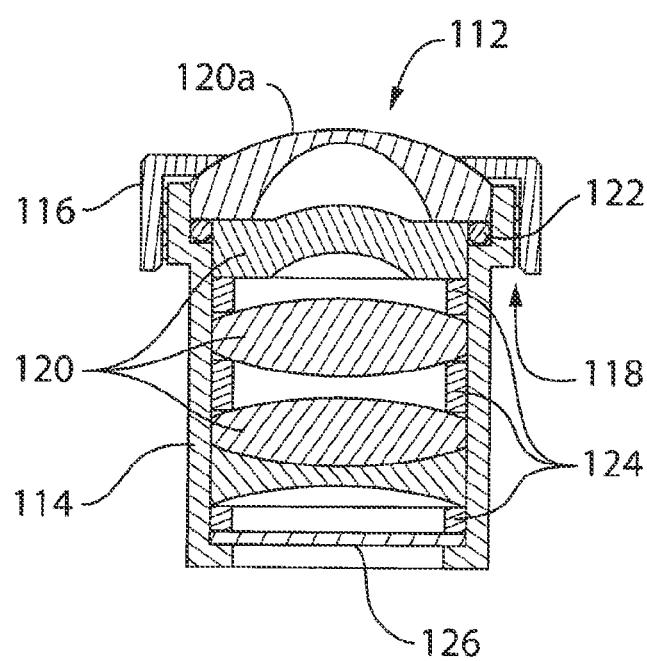
FIG. 4 is a cross-sectional view of a prior art lens.

FIG. 3 shows a variant 100 of the rear view camera 10. This embodiment incorporates a lens 112, a front housing/lens holder 130, a back housing 132 and an imager 140. As shown in greater detail in FIG. 4, the lens 112 includes a lens barrel 114 in which lens optical elements 120, O-ring 122, spacers 124 and IR cutoff filter 126 are mounted and held in place by a retainer cap 116. The front housing 130 holds the lens barrel 114 via a threaded connection, or an adhesive flange as discussed above. A printed circuit board (PCB) 138 with imager 140 is mounted in the housing defined by the front and back housing parts 130, 132. Screws 134 are used for this purpose. In order to mount the lens 112, it is first positioned in the housing 130, 132 by a robot or multi-axis focusing machine (not shown) so as to provide a focused image relative to the imager 140 and once properly aligned the lens 112 is thereafter fixedly attached to the front housing 130. The sealing between the lens 112 and front housing 130 is preferably provided by the adhesive discussed above, or by utilizing a thread lock device. Then, the back housing 132 is attached to the front housing 130 by laser or ultrasonic welding, adhesive, or via a press fitting.

Embodiment 2—Integration of Lens Barrel and Camera Lens Holder

FIG. 5 shows another embodiment 110 of a vehicular camera, wherein the lens barrel 114 housing the optical components of the lens 112 and the camera front housing 130 form a single integrated piece 150. The lens optical elements 120, O-rings and spacers 122, 124 and IR cutoff filter 126 (FIG. 4) are placed inside a lens barrel portion 114' of the integrated lens barrel and camera upper housing piece 150 as part of the conventional lens assembly process to provide a lens 112' (FIG. 5). The integrated piece 150 can be formed by plastic injection molding or metal machining. Plastic injection molding is preferred for lower cost and ease of attaching the back housing 132 to the integrated piece 150 by gluing, laser or ultrasonic welding.

The PCB 138 with imager 140 is mounted to the integrated piece 110. Lens 112' is focused relative to the imager 140 by applying techniques described in embodiments 3 to 6.

The advantages of this embodiment 110 include a savings in tooling cost as one expensive upper housing plastic molding tool is eliminated; material cost savings since less plastic material is used and no expensive adhesive or thread lock epoxy is needed; and a more simplified camera assembly process since the step of attaching the lens to the upper housing is eliminated.

Embodiment 3—Lens Barrel Dropped on Surface of Imager

FIG. 6 shows another embodiment 200 of a vehicular camera wherein the lens barrel 114' of the integrated piece 150 is dropped onto and sits directly on top of the surface of the imager 140. During the camera assembly process, the lens barrel 114' is dropped directly onto the imager 140 as shown in FIG. 6. The lens barrel 114' includes a special designed mechanical feature such as rebate 202 (see detail view of FIG. 6A) so that, while the lens barrel 114' is dropped to onto the imager 140, the rebate 202 guides the lens 112' to have proper horizontal alignment such that the lens optical axis is in line with the center of the imager sensing area.

(The alignment of optics axis to the center of the imager can also be achieved by digital shifting of image sensing window on imager. This digital center shifting feature can be found in some imagers, e.g., Aptina MT9V126 CMOS imager.)

Figure 7:
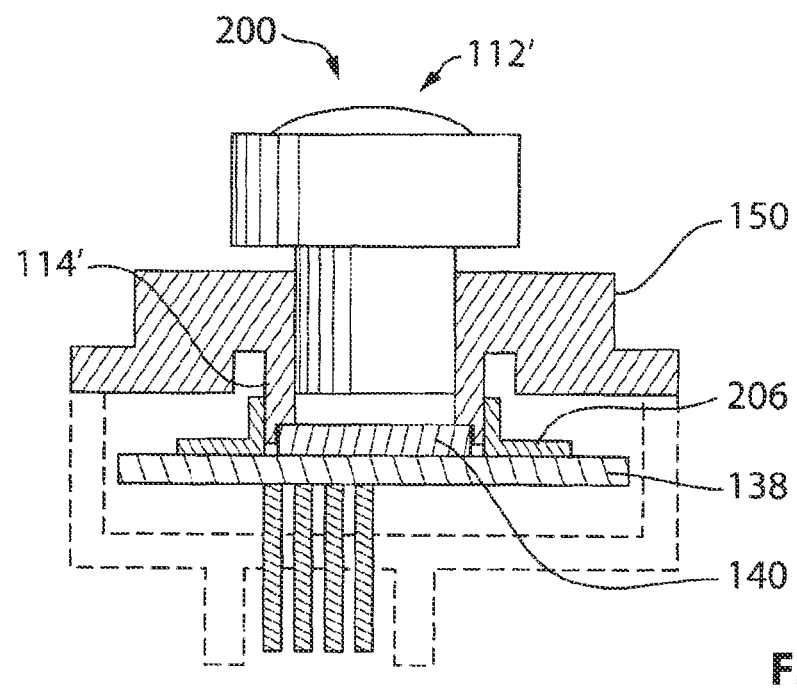
FIG. 7 is a schematic cross-sectional view of a variant of the third embodiment.

As shown in FIG. 6, the lens 112' can be secured by applying adhesive 204 (such as UV-cured adhesive) around the interface of the lens barrel 114' with the imager 140 and PCB 138, thus fixing the lens focus position. In a variant 200' shown in FIG. 7, an alternative way to fix the lens 112' to the imager 140 is to include metal insert pins 206 in the lens barrel 114'. The metal insert 206 is then soldered to the PCB 138 during PCB reflow process to fix the lens 112' to the PCB 138.

Figure 8:
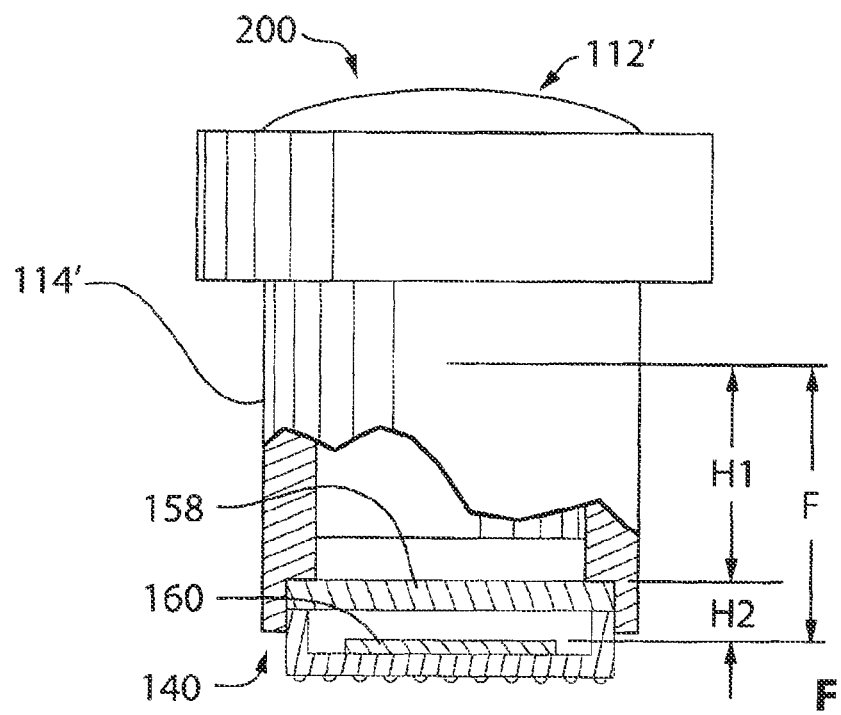
FIG. 8 is a detail cross-sectional view of the third embodiment.

As shown in FIG. 8, the distance from the lens principal plane LPP to the lens seating surface H1 (which is defined by a cover glass 158 that is spaced apart from imaging sensor surface 160), and the distance H2 between the imaging sensor surface 160 to the top surface of cover glass 158 need to satisfy the relation H1+H2=F+ΔF, where F is the effective focal length of the lens, and ΔF is the focus tolerance range.

ΔF multiplied by two (ΔF*2) is also called depth of focus, which can range from a few micrometers to hundreds of micrometers. For a typical automotive camera, the depth of focus is about 40 to 70 micrometers. H1 and H2 are the two sources that contribute to the variation of focus. The lens barrel 114' may be designed to have a tightly controlled length tolerance. The barrel length can be designed such that when it is dropped on the imager cover glass 158, the lens is focused right to the imager sensing surface 160 nominally. The imager 140 can also be designed such that the distance H2 between the sensing surface 160 and the top cover glass surface of the imager has a tight tolerance. However, the lenses and imagers manufactured will always have variations from their designed nominal values. The variation of H1 and H2 can stack up and drive the lens imager pair out of focus.

To control the focus tolerance and increase manufacturing yield, one or more of the following methods can be employed:

First, use optical technology such as wavefront coding as promoted by OmniVision. The technology uses specially designed lens elements and image processing algorithm to increase the depth of focus (ΔF) of the lens. The wider lens depth of focus allows more tolerate of focus position variation. The manufacturing yield and product focus quality can be maintained high.

Second, use a laser or other means to cut or ablate extra lens barrel material in the bottom of the lens barrel 114' so that the correct lens barrel length can be altered to achieve good focus. A pre-laser ablation focus measurement is performed to determine how much barrel material to ablate. To address the case that the lens being too short, one can design the lens barrel so that it is always in the longer side.

Third, bin and match lens 112' and imager 140 to achieve good drop-on focus. The idea is to measure and sort lenses and imagers. Bin the lenses and imagers to matching groups. For example, a lens group with Plus 20 to 30 micrometer too long of flange focal length is matched with an imager group with Minus 20 to 30 micrometer too short of silicon to top glass distance. The two groups will form a good focus camera.

It will thus be seen that by directly dropping the lens 112' to the image sensor 140, it is possible to avoid a time-consuming assembly step in the camera manufacturing process which requires actively searching for best focus position. It results in a reduced cycling time and increased production efficiency, and avoids the use of a very expensive multi-axis focus machine.

Embodiment 4—Lens Focus by PCB Mounting and Focusing Screws

Figure 9:
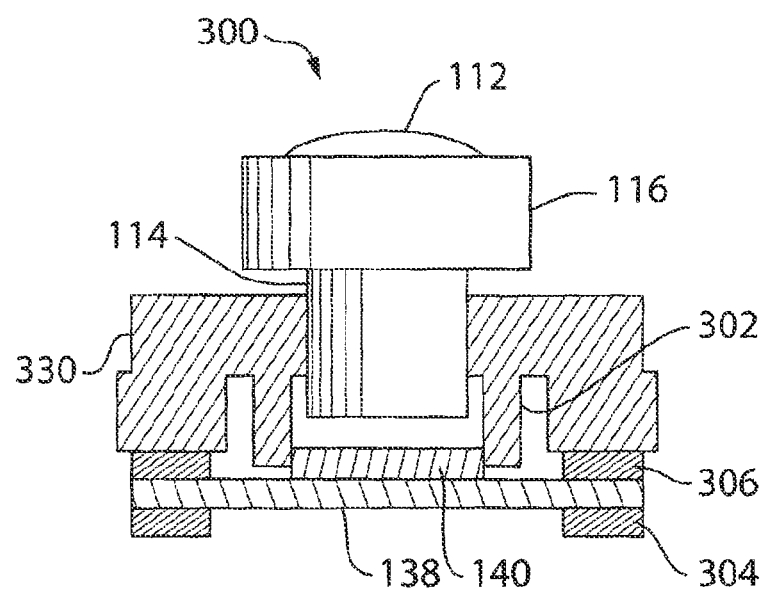
FIG. 9 a schematic cross-sectional view of a fourth embodiment of the invention wherein a lens is focused by PCB mounting screws.

FIG. 9 shows another embodiment 300 of a vehicular camera where a camera front housing 330 includes a mechanical guidance feature such as wall 302 for guiding the lens 112 to proper horizontal alignment with the imager 140 so that the lens optical axis is in line with the center of the imager sensing surface. In this embodiment, the PCB 138 with imager 140 is attached to the front housing 330 by screws 304 but also utilizing compressive gaskets, wave washers or lock washers 306 held between the PCB 138 and body of the front housing 330. The focusing between the lens 112 to imager 140 is accomplished by turning these screws 304 and actively monitoring camera output.

The alignment of the lens optical axis and imager center can be achieved by digitally shift the image window on the imager.

Figure 10:
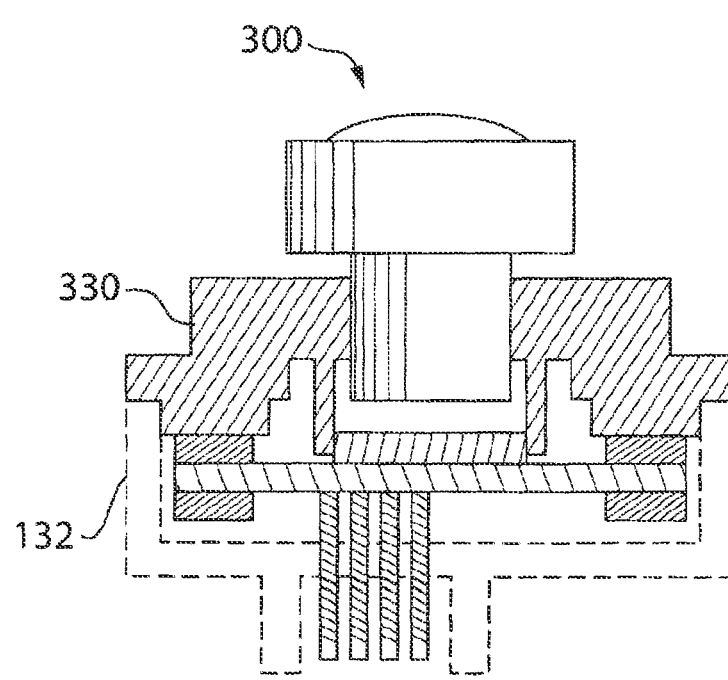
FIG. 10 is a schematic cross-sectional view of the fourth embodiment including a back housing.

Referring additionally to FIG. 10, the attachment of the camera back housing 132 to the front housing 330 (not drawn in this drawing) can be achieved by laser or ultrasonic welding, glue, press fitting, screw together or other means.

The camera front housing in this embodiment may also employ an integrated lens barrel as discussed in with reference to embodiment 110.

Embodiment 5—Lens Focused by Positioning of Camera Front and Back Housings

Figure 11:
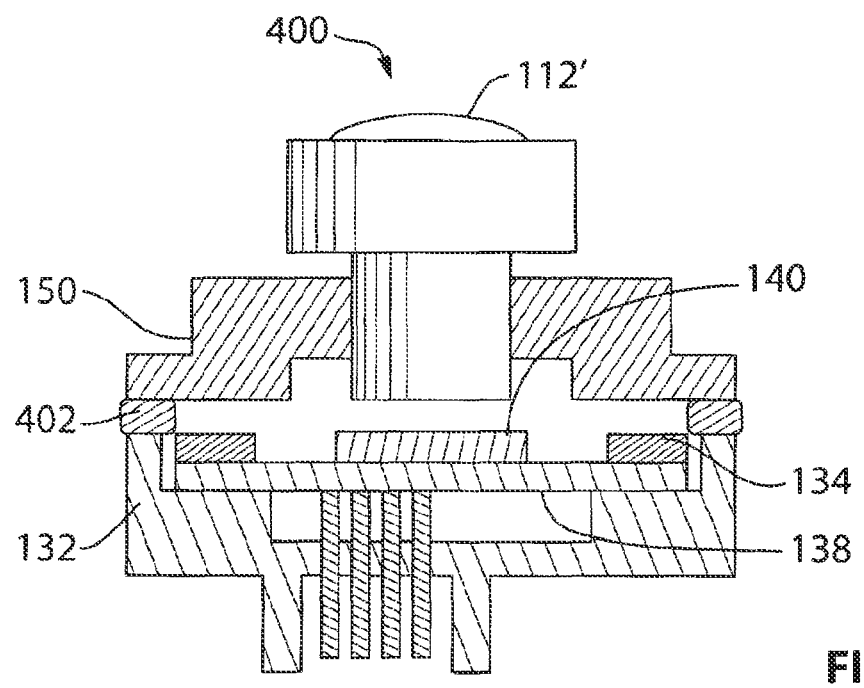
FIG. 11 is a schematic cross-sectional view of a fifth embodiment of the invention wherein a lens is focused by the selective positioning of camera front and back housings.

FIG. 11 shows another embodiment 400 of a vehicular camera in which the integrated lens barrel and camera upper housing piece 150 of embodiment 110 is attached to the camera back housing 132 by UV cured glue 402. The glue is applied before focus. An active focus and alignment (utilizing a multi-axis focusing machine) is performed to reach optimum lens focus and optical axis alignment to the imager center. While holding the integrated lens barrel and camera front housing piece 150 in the position achieving the best focus and alignment, a robot applies UV illumination to the adhesive to cure it and fix the position of the lens 112' and seal the camera. In this embodiment, the PCB 138 is mounted to back housing by screws 134, glue between PCB and back housing or other means.

Figure 12:
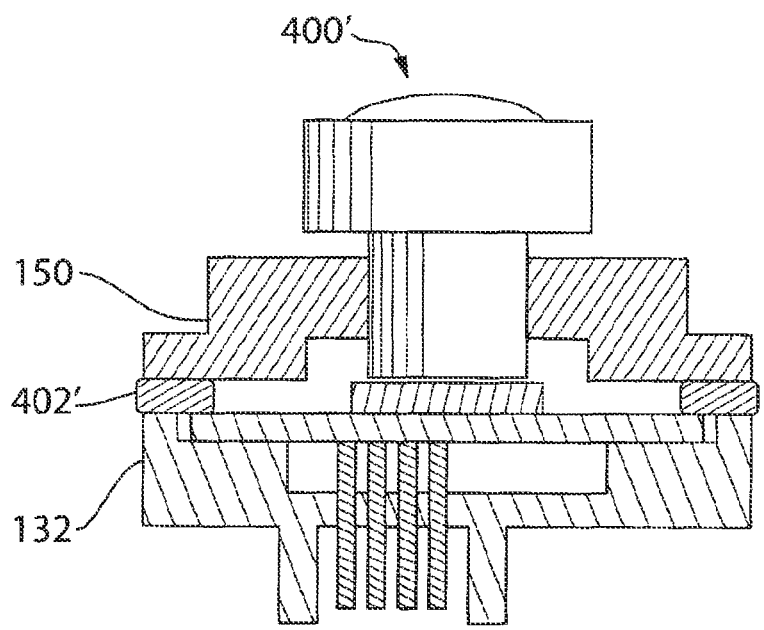
FIG. 12 is a schematic cross-sectional view of a variant of the fifth embodiment.

In a variant 400' shown in FIG. 12, the UV cured adhesive 402' also replaces the screws 134 used to mount the PCB 138 to the housing. The adhesive 402' thus attaches the PCB 132 to the back housing 138, fixes the integrated piece 150 to the back housing 132, and seals the camera.

Figure 13:
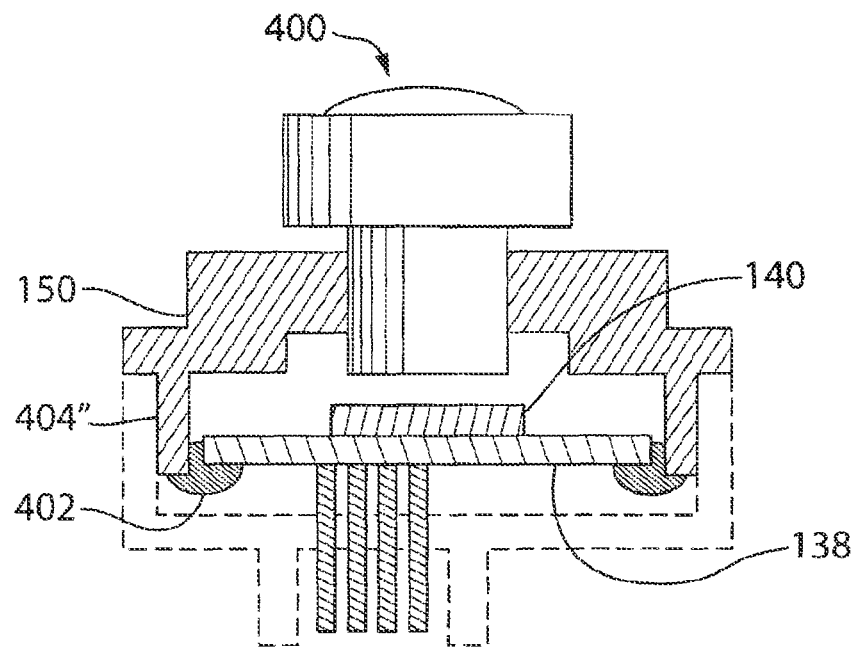
FIG. 13 is a schematic cross-sectional view of a variant of the fifth embodiment, wherein a PCB is selectively positioned.

In another variant 400" shown in FIG. 13, the imager PCB is focused and aligned and then fixed to the lens barrel and camera front housing piece 150 by UV cured adhesive 402" applied on and between the PCB 138 and standoff parts 404" of the integrated piece 150. During the focus assembly process, the imager PCB 138 is grabbed and moved in x, y and z direction(s), and optionally in two rotational directions, to achieve optimum focus and alignment. While the imager PCB 138 is being held in the position, UV illumination is applied to cure the adhesive 402".

Embodiment 6—Direct Attachment of Lens and Imager by Adhesive

Figure 14:
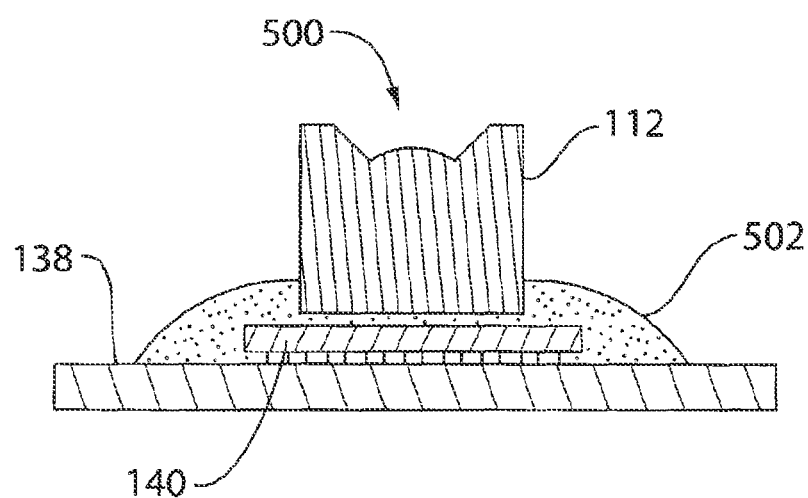
FIG. 14 is a schematic cross-sectional view of a sixth embodiment of the invention wherein a lens is focused by directly attaching a lens to an imager through a transparent adhesive.

FIG. 14 shows another embodiment 500 of a vehicular camera in which transparent UV-curable adhesive 502 is applied directly between lens 112 and imager 140 and/or PCB 138. The adhesive 502 is provided as a relatively large blob to bonds the lens 112 to the imager 140 and/or the PCB 138. The focus and alignment of the lens 112 is performed before UV light cures the adhesive. The adhesive preferably encapsulates the imager 140 and acts a protective shield for it.

In a preferred method of assembly, adhesive is applied on and around the imager in a controlled amount. A 5-axis robot (not shown, with motions in x, y, z and two orthogonal rotations) also grips and dips the lens into a batch of adhesive. The robot then focuses and aligns the lens to the imager, whereupon UV light is applied to cure the adhesive. The robot then releases the lens.

This embodiment simplifies the lens barrel design and reduces the lens size. This embodiment can also be more advantageous than embodiments that utilize a threaded lens, which can be slow to focus or difficult to hold, or a press-fit lens, which provides only coarse movement and thus can be difficult to control. Thus, a more accurate alignment can be obtained.

In all of the foregoing embodiments it is also desired to reduce the cost of the lens itself. This can be accomplished in one or more of the following ways.

First plastic may be used for the lens barrel 114 and retainer cap 116. The barrel and cap are preferably made by injection molding of plastic material like PPS. This material is dense, nonporous, and rigid, and has ultra-low hygroscopic characteristics and thus it meets the special environmental and durability requirements for a rear view camera lens.

Second, the lens 112' may be formed to incorporate only one glass element as the outer-most element 120a (FIG. 4) of the lens, and utilize two or three plastics lens (made by injection molding) for the inner optical elements. An alternative configuration may include two glass elements and one or two plastic lenses. Minimizing the number of glass elements reduces cost of the optical components.

In addition, cost savings can be realized by eliminating the lens IR cutoff filter 126 which is conventionally provided as a glass plate. Instead, the IR cutoff filter can be moved to the imager cover glass 120a. One added benefit of eliminating the IR cutoff filter in the lens is that it reduces or eliminate light multi-reflection between the flat IR cutoff filter and imager cover glass 120a. This multi-reflection can cause lens flare and ghost images.

Figure 15:
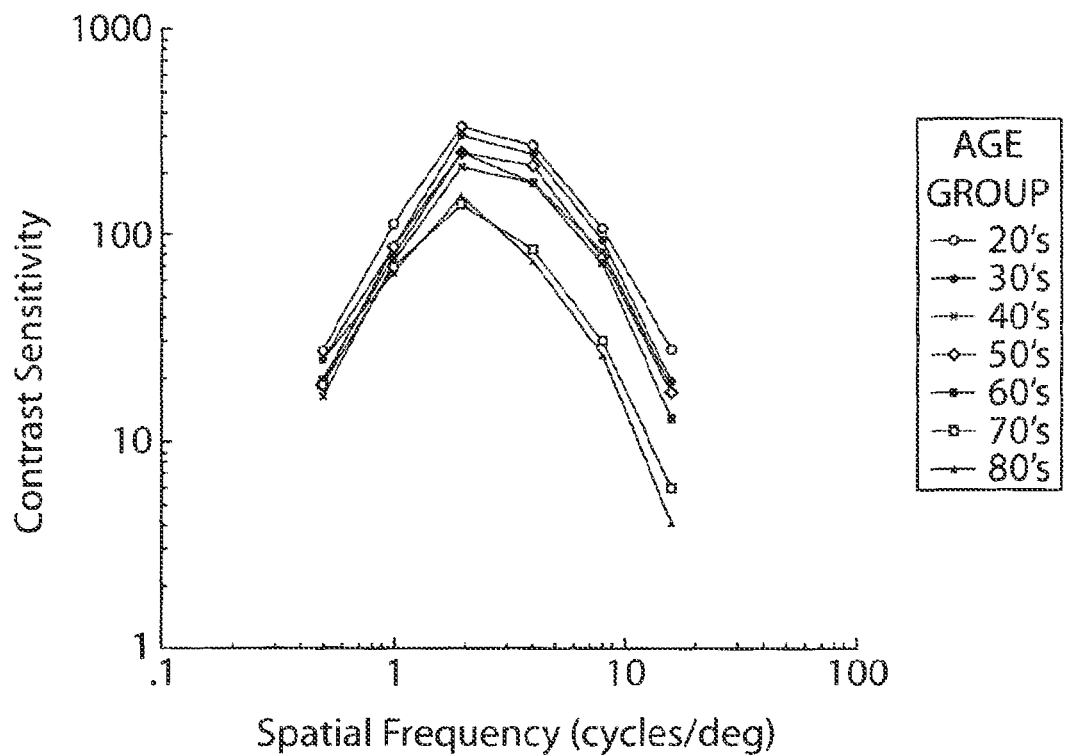
FIG. 15 is a graph of a contrast sensitivity function.

Third, lens cost can be reduced by lowering the lens resolution. The lens resolution can be reduced to a level that fits the application requirement of the camera. More particularly, the human eye resolution perception can be represented by a contrast sensitivity function (CSF) as shown in FIG. 15. The CSF peaks within a range of 1 to eight cycles per degree, where a cycle is defined as a one transition from black to white (or vice versa), which may be referred to in the literature as a "line pair". Thus, a required resolution can be determined from the display size, the distance between the observer and the display, the selected CSF, and the size of the imager sensing surface.

For example, consider a 7-inch diagonal display (with a 16×9 aspect ratio. It has a horizontal dimension of 155 mm. Assume the distance between the observer and the display is 600 mm, which is the average distance between a driver's eyes and a display in the vehicle center console. Select a CSF of 7 cycles per degree, which is a reasonable compromise between machine vision and human vision requirements. And assume that the imager has a horizontal sensing width of 3.58 mm. One angular degree represents a width of 10.5 mm at distance of 600 mm. The display resolution required is 0.67 line pairs/mm. The required camera resolution is thus 28.9 line pairs per mm. Thus, a camera can produce a sufficient resolution is its lens yields a camera level modulation transfer function of 28.9 line pairs per mm.

Other examples of sufficient camera resolutions are provided in the chart below:

| Display diagonal size (inch) | 8 | 7 | 6 | 3.5 | 2.5 |
|---|---|---|---|---|---|
| Aspect Ratio | 16 X 9 | 16 X 9 | 16 X 9 | 4 X 3 | 4 X 3 |
| Horizontal Dimension (mm) | 177 | 155 | 133 | 71.1 | 50.8 |
| Eye to Display Distance (mm) | 600 | 600 | 600 | 500 | 500 |
| mm per 1 degree at Display | 10.5 | 10.5 | 10.5 | 8.7 | 8.7 |
| At display resolution (lp/mm) | 0.668 | 0.668 | 0.668 | 0.802 | 0.802 |
| Required camera resolution (lp/mm) | 33.0 | 28.9 | 24.8 | 15.9 | 11.4 |

Thus, lens resolution can be reduced to the limits dictated by the CSF in order to reduce cost. Prior art lenses may have too high resolution for human visual perception, and high resolution lenses can adversely cause a negative consequence called the "Moire Effect". Some of prior art camera designs utilized an optical low pass filter to lower the image sharpness of the lens to eliminate the "Moire Effect". The optical low pass filter adds cost to camera along with the higher cost high resolution lens.

Figure 16:
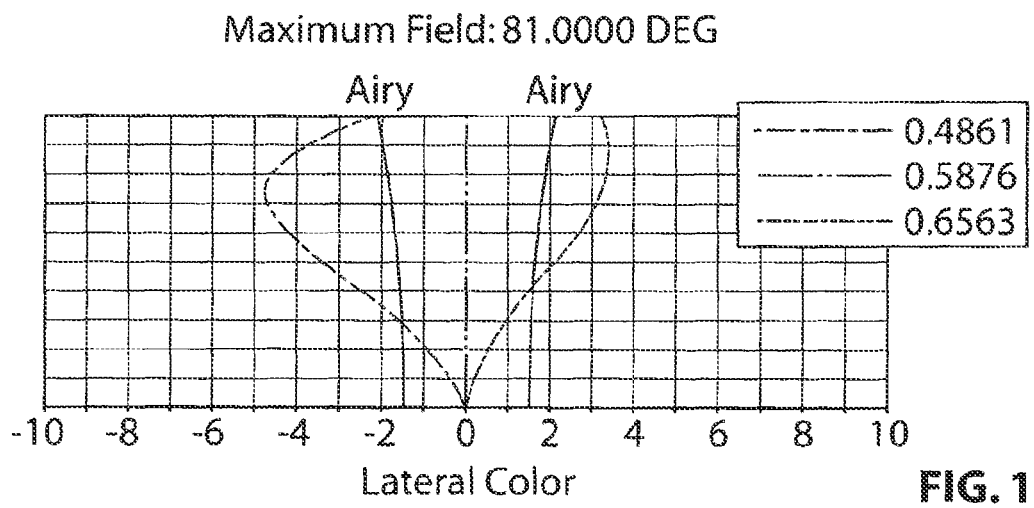
FIG. 16 is a graph of an example of lens chromatic aberration.

Fourth, lens cost can be reduced by not optically addressing any chromatic aberration in lens. Lens chromatic aberration can cause the resultant image to have color fringes at the edges of objects, as well as lower image resolution. Lens chromatic aberration can typically be fixed or mitigated by a pair of glass lens cemented together, the so-called achromat pair. However, for a low cost lens solution, the chromatic aberration is not fixed in the lens, rather, the imager system-on-chip (SOC) or an adjunct digital processor applies digital correction to correct the chromatic aberration. The chromatic aberration typically has fixed amount of spatial separation among different colors at a specific off-axis angle, as shown in the lateral color diagram example of FIG. 16.

The basic principle of digital correction of chromatic aberration is as follows.

Every pixel of an imager has individual values of red, green and blue colors. By shifting one pixel colors to one or more other pixels, and repeat the process to the whole imager, it is possible to correct or reduce the effect of lens chromatic aberration. Based on the lateral color separation of the lens, like the example graph shown in FIG. 16, the separation of the color as a function of the distance from the center of the imager is known. For each imager pixel, it is possible to calculate the distance needed to shift every individual colors of the pixel. The shift happens in a radial direction because of the lens' symmetry to its axis. In each pixel, new position coordinates of each color is re-calculated. Then this color value will be sent to the new pixel whose coordinates were calculated. The other two colors of this pixel are also calculated and sent to new pixels.

This shifting or redistribution of the pixel colors can be performed in System-On-Chip (SOC) part of imager, or a separate processor after the imager. The processor can be a microprocessor, a DSP, or a FPGA or other digital devices. Adding some gates or logical units to an existing digital processing unit most likely is less expensive than adding achromat glass elements in lenses. The lens chromatic aberration is typically symmetric over the optical axis, which lowers the complexity of digital chromatic aberration in the SOC or processor.

Lens manufacturing variation may cause the chromatic aberration to not be totally cylindrically symmetric. The spectral response of every imager pixel may thus have variations. To correct the negative effect to digital chromatic aberration caused by these two variations, one can apply calibration procedures. During a calibration procedure, a special target, an image acquisition and image processing algorithms are used to calculate lateral color separation at every pixel. Then the pixel related lateral color values are used in digital chromatic aberration correction process described above.

While the above describes particular embodiment(s) of the invention, it will be appreciated that modifications and variations may be made to the detailed embodiment(s) described herein without departing from the spirit of the invention.

The invention claimed is:

1. A vehicular camera assembly, said vehicular camera assembly comprising:

a camera housing comprising a front housing portion and a rear housing portion;

said front housing portion comprising (i) a lens, (ii) an imager and (iii) an imager printed circuit board;

wherein said imager comprises a complementary metal-oxide-semiconductor (CMOS) image sensor;

wherein said lens comprises a plurality of optical elements;

wherein said imager printed circuit board has a first side and a second side opposite the first side, and wherein the second side of said imager printed circuit board is separated from said first side of said imager printed circuit board by a thickness dimension of said imager printed circuit board;

wherein said imager printed circuit board comprises electronic circuitry at least on the first side of said imager printed circuit board, and wherein the electronic circuitry of said imager printed circuit board comprises said imager;

wherein said imager comprises an outer surface and an inner surface, and wherein the inner surface of said imager is mounted at the first side of said imager printed circuit board;

wherein said lens is held in position relative to said imager by an adhesive;

wherein the adhesive comprises a UV-curable adhesive;

wherein, with said lens held in position relative to said imager by the adhesive, the outer surface of said imager is devoid of the adhesive and an air gap exists between said lens and the outer surface of said imager;

wherein, with the adhesive disposed in an uncured state on said imager printed circuit board laterally outboard of said imager, and with said lens positioned relative to said imager, the adhesive is cured from its uncured state to an at least partially-cured state by exposure to UV light;

wherein the plurality of optical elements of said lens comprises a frontmost optical element, and wherein, with said lens held in position relative to said imager by the adhesive, said frontmost optical element is distanced further from said imager than any other optical element of the plurality of optical elements of said lens, and wherein any other optical element of the plurality of optical elements of said lens is disposed between said frontmost optical element and said imager;

wherein said frontmost optical element comprises a glass lens element;

wherein the plurality of optical elements of said lens comprises at least one plastic lens element;

wherein said vehicular camera assembly comprises a vehicular rearview camera assembly that, when attached at a vehicle equipped with said vehicular camera assembly, generates video images that assist a driver of the equipped vehicle when backing up the equipped vehicle;

wherein said rear housing portion is joined at said front housing portion;

wherein said vehicular camera assembly comprises circuitry operable to process video images captured by said imager when said vehicular camera assembly is disposed at the equipped vehicle;

wherein said rear housing portion of said camera housing comprises a connector portion configured for electrically connecting said vehicular camera assembly to electrical wiring of the equipped vehicle;

wherein said connector portion of said rear housing portion comprises a plurality of individual electrically conductive pins;

wherein each individual electrically conductive pin of said plurality of individual electrically conductive pins has a first end that terminates interior of said camera housing and a second end that terminates exterior of said camera housing; and wherein the second end that terminates exterior of said camera housing is accessible from exterior said camera housing.

2. The vehicular camera assembly of claim 1, wherein said vehicular camera assembly comprises a processor operable to process video images captured by said imager when said vehicular camera assembly is disposed at the equipped vehicle.

3. The vehicular camera assembly of claim 2, wherein said processor is disposed in said vehicular camera assembly separate from said imager.

4. The vehicular camera assembly of claim 3, wherein said front housing portion comprises an integrated barrel portion that accommodates the optical elements of the plurality of optical elements of said lens.

5. The vehicular camera assembly of claim 4, wherein the plurality of optical elements of said lens comprises at least two plastic lens elements.

6. The vehicular camera assembly of claim 5, wherein the plurality of optical elements of said lens comprises at least two glass lens elements, one of which comprises said frontmost optical element.

7. The vehicular camera assembly of claim 3, wherein said front housing portion comprises a lens barrel, and wherein the optical elements of the plurality of optical elements of said lens are accommodated within the lens barrel.

8. The vehicular camera assembly of claim 7, wherein the plurality of optical elements of said lens comprises at least two plastic lens elements.

9. The vehicular camera assembly of claim 8, wherein the plurality of optical elements of said lens comprises at least two glass lens elements, one of which comprises said frontmost optical element.

10. The vehicular camera assembly of claim 7, wherein an electrical connector configured for electrically connecting said vehicular camera assembly to electrical wiring of the equipped vehicle is disposed at said connector portion of said rear housing portion, and wherein said electrical connector comprises said plurality of individual electrically conductive pins.

11. The vehicular camera assembly of claim 10, wherein video images captured by said imager are transmitted via the electrical wiring of the equipped vehicle to at least one vehicular device of the equipped vehicle.

12. The vehicular camera assembly of claim 11, wherein the at least one vehicular device of the equipped vehicle comprises a display controller for a cabin-mounted display of the equipped vehicle.

13. The vehicular camera assembly of claim 12, wherein at least one graphic overlay is generated at said vehicular camera assembly and is transmitted via the electrical wiring of the equipped vehicle to the at least one vehicular device of the equipped vehicle.

14. The vehicular camera assembly of claim 13, wherein the adhesive holding said lens in position relative to said imager comprises a glass transition temperature of at least 90 degrees Celsius.

15. The vehicular camera assembly of claim 13, wherein the adhesive comprises an epoxy-amine.

16. The vehicular camera assembly of claim 15, wherein the adhesive holding said lens in position relative to said imager has less than a 60% reduction in bond shear strength at 85 degrees Celsius.

17. The vehicular camera assembly of claim 13, wherein said rear housing portion is joined at said front housing portion via welding.

18. The vehicular camera assembly of claim 13, wherein said rear housing portion is joined at said front housing portion via laser welding.

19. The vehicular camera assembly of claim 13, wherein said rear housing portion is mechanically joined at said front housing portion.

20. The vehicular camera assembly of claim 19, wherein said rear housing portion and said front housing portion are screwed together.

21. The vehicular camera assembly of claim 13, wherein the adhesive is disposed in its uncured state on said imager printed circuit board laterally outboard of said imager as a layer of uncured adhesive having a thickness that provides for angular adjustment when said lens and said imager are being positioned one to another.

22. The vehicular camera assembly of claim 21, wherein the adhesive comprises an epoxy.

* * * * *